United States Patent
Frank et al.

(10) Patent No.: US 10,833,150 B2
(45) Date of Patent: Nov. 10, 2020

(54) FAST RECRYSTALLIZATION OF HAFNIUM OR ZIRCONIUM BASED OXIDES IN INSULATOR-METAL STRUCTURES

(71) Applicant: INTERNATIONAL BUSINESS MACHINES CORPORATION, Armonk, NY (US)

(72) Inventors: Martin M. Frank, Dobbs Ferry, NY (US); Kam-Leung Lee, New York, NY (US); Eduard A. Cartier, New York, NY (US); Vijay Narayanan, New York, NY (US); Jean Fompeyrine, Waedenswil (CH); Stefan Abel, Zürich (CH); Oleg Gluschenkov, Tannersville, NY (US); Hemanth Jagannathan, Niskayuna, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/032,632

(22) Filed: Jul. 11, 2018

(65) Prior Publication Data

US 2020/0020762 A1    Jan. 16, 2020

(51) Int. Cl.
*H01L 21/00* (2006.01)
*H01L 29/04* (2006.01)
(Continued)

(52) U.S. Cl.
CPC ........ *H01L 29/04* (2013.01); *H01L 21/02181* (2013.01); *H01L 21/02189* (2013.01);
(Continued)

(58) Field of Classification Search
CPC ......... H01L 21/02181; H01L 21/02189; H01L 29/516; H01L 27/11585; H01L 27/11502
See application file for complete search history.

(56) References Cited

U.S. PATENT DOCUMENTS 6,783,591 B1    8/2004   Halliyal et al.
7,439,571 B2   10/2008   Doczy et al.
(Continued)

OTHER PUBLICATIONS

Frank, M.M. et al., "Deuterium Passivation of TiN/HfO2/Al2O3/InGaAs gate stacks: Pressure and temperature dependence" SISC (Dec. 2017) pp. 1-2.
(Continued)

*Primary Examiner* — Nicholas J Tobergte
(74) *Attorney, Agent, or Firm* — Tutunjian & Bitetto, P.C.; Randall Bluestone

(57) ABSTRACT

A method for converting a dielectric material including a type IV transition metal into a crystalline material that includes forming a predominantly non-crystalline dielectric material including the type IV transition metal on a supporting substrate as a component of an electrical device having a scale of microscale or less; and converting the predominantly non-crystalline dielectric material including the type IV transition metal to a crystalline crystal structure by exposure to energy for durations of less than 100 milliseconds and, in some instances, less than 10 microseconds. The resultant material is fully or partially crystallized and contains a metastable ferroelectric phase such as the polar orthorhombic phase of space group $Pca2_1$ or $Pmn2_1$. During the conversion to the crystalline crystal structure, adjacently positioned components of the electrical devices are not damaged.

14 Claims, 11 Drawing Sheets

(51) Int. Cl.
*H01L 21/02* (2006.01)
*H01L 29/06* (2006.01)
*H01L 29/51* (2006.01)

(52) U.S. Cl.
CPC .... *H01L 21/02686* (2013.01); *H01L 29/0649* (2013.01); *H01L 29/516* (2013.01)

(56) References Cited

U.S. PATENT DOCUMENTS

| | | | | |
|---|---|---|---|---|
| 7,723,767 | B2* | 5/2010 | Li | H01L 21/31155 257/300 |
| 8,569,823 | B2* | 10/2013 | Ino | H01L 27/11568 257/321 |
| 8,791,519 | B2 | 7/2014 | Li et al. | |
| 9,613,870 | B2 | 4/2017 | Ando et al. | |
| 2006/0267066 | A1* | 11/2006 | Li | H01L 21/31155 257/310 |
| 2009/0195967 | A1* | 8/2009 | Srividya | C23C 16/40 361/524 |
| 2015/0179657 | A1* | 6/2015 | Inumiya | H01L 29/516 257/295 |
| 2015/0311067 | A1 | 10/2015 | Sharma et al. | |
| 2016/0005749 | A1 | 1/2016 | Li et al. | |
| 2016/0379830 | A1 | 12/2016 | Dasgupta et al. | |
| 2018/0053832 | A1* | 2/2018 | Beyer | H01L 29/4908 |
| 2018/0166453 | A1* | 6/2018 | Muller | H01L 28/40 |

OTHER PUBLICATIONS

Gilmer, D.C. et al., "LASER Anneal to Enable Ultimate CMOS Scaling with PMOS Band Edge Metal Gate/High-K Stacks" 2006 European Solid-State Device Research Conference (Sep. 2006) pp. 1-4.

Park, M.H. et al., "Ferroelectricity and Antiferroelectricity of Doped Thin $HfO_2$-Based Films" Advanced Materials (Feb. 2015) pp. 1-21, vol. 27, No. 11.

Ushakov, S.V. et al., "Effect of La and Y on crystallization temperatures of hafnia and zirconia" Journal of Materials Research (Mar. 2004) pp. 693-696, vol. 19, No. 3.

Ushakov, S.V. et al., "Crystallization in hafnia-and zirconia-based systems" Physica Status Solidi (b) (Jul. 2004) pp. 2268-2278, vol. 241, No. 10.

* cited by examiner

FAST RECRYSTALLIZATION OF HAFNIUM OR ZIRCONIUM BASED OXIDES IN INSULATOR-METAL STRUCTURES

BACKGROUND

Technical Field

The present invention generally relates to microelectronic device processing, and more particularly to the formation of crystalline, ferroelectric high-k dielectrics.

Description of the Related Art

The term high-κ dielectric refers to a material with a high dielectric constant κ (as compared to silicon dioxide). High-κ dielectrics are used in semiconductor manufacturing processes where they are usually used to replace a silicon dioxide gate dielectric or another dielectric layer of a device. The implementation of high-κ gate dielectrics is one of several strategies developed to allow further miniaturization of microelectronic components, colloquially referred to as extending Moore's Law. Some examples of uses for high-k dielectrics include gate dielectrics in field effect transistors (FETs), node dielectrics in capacitors, and high-k dielectrics in memory devices. In these devices, high-κ dielectrics are generally utilized in their amorphous form and their complete crystallization is avoided. Amorphous high-κ dielectrics provide many robust properties including improved electrical reliability, durability, absence of an excessive oxidation of adjacent semiconducting material, and overall material stability during device operation. Crystallization studies of hafnium (Hf) or zirconium (Zr) based high-κ dielectrics revealed forming a predominantly monoclinic crystalline phase and, in some instances, a mixture of monoclinic and tetragonal crystalline phases. Tetragonal and cubic phases have a higher κ and is therefore preferred over monoclinic phase.

Ferroelectric materials exhibit particularly advantageous intrinsic properties that can be changed through an applied electric field. They can be applied for their electro-optic or piezoelectric properties. Some examples of uses for ferroelectric materials (or antiferroelectric materials) include ferroelectric random access memory devices (FERAM), ferroelectric field effect transistors (FeFET), neuromorphic circuits, steep-slope low-power logic or in energy storage applications. It has been discovered that thin Hf and Zr based dielectrics may form a polar orthorhombic phase with the space groups Pca21 or Pmn21 that is believed to exhibit a ferroelectric behavior when crystallized at around 650 C with rapid thermal anneal with the characteristic anneal duration of several seconds.

Metal-insulator-metal (MIM) structures have been employed in a variety of electronic devices acting as a capacitor or a tunneling structure. Particular useful MIM elements are embedded into integrated circuit (IC) metallic interconnect network and formed in back-end-of-line (BEOL) process module together with the interconnects.

SUMMARY

In accordance with an embodiment of the present invention, a method is provided for converting a predominantly non-crystalline material into a crystalline material. In one embodiment, the method includes forming a predominantly non-crystalline dielectric material including a type IV transition metal on a supporting substrate as a component of an electrical device having a scale of microscale or less. The predominantly non-crystalline dielectric material including the type IV transition metal can then be converted to a crystalline crystal structure by exposure to energy for nanosecond duration, wherein during said exposure to energy a crystallization temperature greater than 1300° C. is provided for said nanosecond duration. During the conversion to the crystalline crystal structure, adjacently positioned components of the electrical device do not experience thermal degradation. Examples of thermal degradation include a change in a threshold voltage of the electrical device resulting from the exposure to energy, a shift in a transistor threshold voltage of the electrical device, thickening of a gate dielectric of the electrical device, degradation of interconnect reliability of the electrical device, degradation of interconnect low-k dielectric.

In another embodiment, the method includes forming a predominantly non-crystalline hafnium oxide containing material on a supporting substrate as a component of an electrical device having a scale of microscale or less. The predominantly non-crystalline hafnium oxide containing material can then be converted to a crystalline crystal structure by exposure to energy by laser annealing, flash annealing, or combination thereof for durations of less than 100 milliseconds. During the conversion to the crystalline crystal structure, adjacently positioned components of the electrical device do not experience thermal degradation. Examples of thermal degradation include a change in a threshold voltage of the electrical device resulting from the exposure to energy, a shift in a transistor threshold voltage of the electrical device, thickening of a gate dielectric of the electrical device, degradation of interconnect reliability of the electrical device, degradation of interconnect low-k dielectric.

In another aspect, an electrical device is provided. In one embodiment, the electrical device may include a first device in a first region of a substrate that includes at least two electrodes, and a partially or fully crystallized dielectric film including type IV transition metals having a ferroelectric phase and a thickness of less than 10 nm. The electrical device may also include a second device in a second region of the substrate that is temperature sensitive, in which the second device displays no thermal degradation in properties. In some embodiments, the partially crystallized dielectric film includes a crystallized portion and an amorphous portion. The crystallized portion can have a polar orthorhombic phase of space group $Pca2_1$ or $Pmn2_1$. The crystallized portion can also have a rhombohedral phase. The crystallized portion can have a tetragonal phase, and can exhibit field induced ferroelectricity.

The second device is free of thermal degradation, in which thermal degradation may be characterized by a change in a threshold voltage of the second device resulting from exposure to energy, a shift in a transistor threshold voltage of the second device, thickening of a gate dielectric of the second device, degradation of interconnect reliability of the second device, degradation of interconnect low-k dielectric in the second device and combinations thereof.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Figure 1:
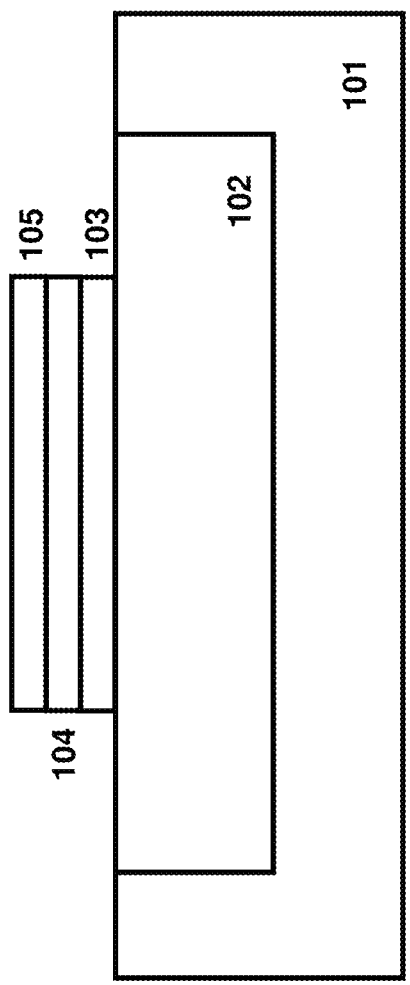
FIG. 1 is a cross-sectional diagram illustrating a thermally isolated metal-dielectric-metal stack formed over a substrate, according to an embodiment of the present invention.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments is intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. For purposes of the description hereinafter, the terms "upper", "lower", "right", "left", "vertical", "horizontal", "top", "bottom", and derivatives thereof shall relate to the embodiments of the disclosure, as it is oriented in the drawing figures. The terms "positioned on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements. It is to be understood that aspects of the present invention will be described in terms of a given illustrative architecture; however, other architectures, structures, substrate materials and process features and steps can be varied within the scope of aspects of the present invention.

Hafnium (Hf) based and zirconium (Zr) based oxides are dielectric materials that are employed as high-k gate dielectrics in complementary metal oxide semiconductor (CMOS) logic field effect transistors, high-k dielectrics in dynamic random access memory (DRAM) memory, and high-k metal insulator metal (MIM) decoupling capacitors. All these devices benefit from having capacitors with a higher capacitance per unit area leading to the use of high-k dielectrics and physically thin high-k films whenever possible. The physical thickness of Hf- and Zr-based oxides in these devices range from 1 nm to 10 nm depending on a particular application but rarely exceeds 10 nm. Ferroelectric compositions (or anti-ferroelectric compositions) are suitable for use in ferroelectric random access memory devices (FE-RAM), ferroelectric field effect transistors (FeFET), neuromorphic circuits, steep-slope low-power logic or in energy storage applications. Ferroelectricity is a characteristic of certain materials that have a spontaneous electric polarization that can be reversed by the application of an external electric field. All ferroelectrics are pyroelectric, with the additional property that their natural electrical polarization is reversible. Hafnium (Hf) based and zirconium (Zr) based oxides may also be employed as ferroelectric compositions. These ferroelectric devices also benefit from having capacitors with a higher capacitance per unit area making thinner ferroelectric films more desirable.

It has been determined that hafnium (Hf) based and zirconium (Zr) based oxides are to be crystalline (e.g. polycrystalline, nanocrystalline, or in a single crystallite) to provide some of the performance characteristics that are desired in some applications as high-k dielectrics or ferroelectric materials. Polycrystalline materials are aggregates of several crystals, crystallites, or grains, in which the boundary between the grain is the grain boundary across which the orientation or phase of the crystal changes. For the purposes of comparison, a single crystal structure consists of only one grain or crystal and hence, no grain boundaries; and an amorphous structure lacks crystalline order beyond the atomic length scale, i.e. amorphous materials are non-crystalline. Each crystal grain or crystallite has its own crystal phase and orientation. In some instances, the polycrystalline aggregate may contain grains which may include different crystalline phases. Orientation of crystallites may be completely random or ordered in which case it is also referred to as textured polycrystalline material. Presence or absence of particular crystalline phases in polycrystalline materials is driven by thermodynamic potentials associated with these phases at the process conditions employed in forming polycrystalline material (e.g. temperature, pressure). Phase diagrams provide a simplified graphical representation of this thermodynamic concept providing insight into dominant crystalline phases as the function of temperature, pressure, and material composition. At ambient pressures, a monoclinic phase with space group $P2_1/c$ has the lowest thermodynamic potential and is a dominant phase for bulk Hf- and Zr-based oxides at lower crystallization temperatures. At higher crystallization temperatures, the tetragonal phase $P4_2/nmc$ has the lowest thermodynamic potential and may dominate in these oxides. At even higher temperatures, the cubic phase $Fm\bar{3}m$ may dominate. The exact cross-over temperatures depend on the material composition. Two or more phases maybe present in polycrystalline oxides, especially in the vicinity of cross-over points, if thermodynamic potentials of several phases are close to each other. Polar phases that exhibit ferroelectric properties do not have the lowest thermodynamic potentials over a wide range of temperatures and specific material compositions in Hf- and Zr-based oxides. However, thermodynamic potentials of the metastable polar orthorhombic phases $Pca2_1$ and $Pmn2_1$ are not far higher than those of the non-polar monoclinic, tetragonal, or cubic phases, as for example shown for $HfO_2$ in T. D. Huan et al., Phys. Rev. B 90, 064111 (2014). This suggests that other external factors such as presence of impurities, confinement, compressive stress, and high external electric field may help to overcome the difference in thermodynamic potentials leading to the presence of polar orthorhombic phases in the resultant polycrystalline aggregate. The enhanced properties achieved by crystallization can include higher permittivity, e.g., formation of tetragonal or cubic phases. The enhanced properties achieved by the above described crystallization of the hafnium (Hf) based and zirconium (Zr) based oxides to a crystalline crystal structure can also include increased ferroelectricity, e.g., the formation of the polar orthorhombic phase of space group $Pca2_1$ or $Pmn2_1$.

In some embodiments, with respect to hafnium (Hf) based and zirconium (Zr) based oxides, it has been determined that efforts to convert material layers that are in a predominantly amorphous phase to a crystalline crystal structure by thermal annealing can involve a thermal budget for crystallization that depends on dielectric film composition, thickness, and confinement. In this context, the thermal budget is defined by two annealing parameters: temperature and duration. Higher thermal budget typically means either higher annealing temperature or longer annealing duration or both. Higher Hf concentration and lower Zr concentration in the dielectric films raise the crystallization thermal budget. Thinner dielectric films often require a higher thermal budget. Confining, constraining, or pinning the top dielectric surface with a deposited material often also raises the crystallization thermal budget for thin films. Nevertheless, it is often desirable to have thinner crystalline dielectric films, e.g. due to an increased capacitance per unit area. Additionally, the presence of top electrode disposed over the dielectric layer (dielectric confinement) during crystallization annealing may promote the formation of a ferroelectric crystalline phase. Presence of certain impurities or dopants such as silicon (Si), nitrogen (N), carbon (C), aluminum (Al), yttrium (Y), or lanthanum (La) in these oxides may also promote forming ferroelectric crystalline phase but may also raise the required crystallization thermal budget. These examples illustrate that the crystallization of thin Hf- and Zr-based oxides may require a substantial thermal budget that negatively affects or degrades other features of integrated circuits and microelectronic devices, such as field effect transistors (FETs), memory devices, capacitors, interconnects, and/or various passive components. Temperature sensitive elements of state-of-the-art complementary metal oxide semiconductor (CMOS) logic circuits typically include the gate structure or "gate stack" of FETs and the interconnect network. Acceptable thermal budget for the gate stack is limited to annealing exposures at about 450° C. for minutes, at about 500° C. for seconds, and at about 950° C. for hundreds of microseconds. Exceeding these thermal budgets thickens the gate dielectric by more than 0.25 Angstroms or shifts transistor threshold voltages by more than 25 millivolts. Acceptable thermal budget for a network of Cu interconnects with low-k interlayer dielectric is limited to annealing exposures at about 400° C. for hours, at about 500° C. for seconds, and at temperatures near but below the melting point of Cu (1085° C.) for several milliseconds. Exceeding these thermal budgets causes a drop in the overall interconnect reliability, degrading both the electromigration-driven reliability for Cu wires or vias and the time dependent dielectric breakdown reliability for interconnect isolation layers. In addition, the dielectric constant of interconnect isolation layers may also increase by more than 5% causing the corresponding increase in wire delays. Other elements may have different thermal budget constraints but their stability and integrity is typically maintained if the gate stack and interconnect thermal budget limitations are satisfied. Accordingly, the maximum thermal budget of BEOL processing should not exceed 400° C. for conventional long duration anneals and 1000° C. for millisecond-scale anneals. It is highly desirable to form crystallized and thin high-k dielectric layers and devices that employ them in the BEOL process module. This is difficult to do for 10 nm-thick or thinner high-k dielectric layers due to a high crystallization thermal budget. Additionally, it is highly desirable to reliably crystallize the thin high-k dielectric into a ferroelectric phase irrespective of the presence or absence of any impurities or dopants in these dielectric films. This is difficult to do because the polar orthorhombic phase of space group $Pca2_1$ or $Pmn2_1$ is not a thermodynamically stable bulk phase, and forming ferroelectric dielectric layers depends on other factors including the presence of intentional or unintentional impurities in the film. Further, this is extremely difficult to do for 5 nm-thick or thinner hafnium-based films due to an increased crystallization thermal budget.

The aforementioned difficulties can be overcome with a high-temperature anneal process that employs high-temperature nanosecond-scale, microsecond-scale, and/or millisecond-scale anneals to crystallize hafnium (Hf) or zirconium (Zr) based oxides and an annealing tool such as flash annealing or laser annealing. The methods and structures of the present disclosure employ high-temperature millisecond and/or nanosecond anneals for crystallization of hafnium based oxides or zirconium based oxides. Microsecond anneals can also be contemplated. This is contrary to the conventional wisdom of using lower crystallization temperatures to prevent a degradation of temperature-sensitive adjacent devices and structures and to be able to form a thermodynamically unfavorable ferroelectric phases.

In some embodiments, the method for converting a dielectric material including a type IV transition metal into a crystalline material begins with forming a predominantly non-crystalline dielectric material including the type IV transition metal on a supporting substrate as a component of an electrical device having a scale of micrometers or less. Turning to FIG. 1, the supporting substrate 101 contains an isolation region 102 upon which the predominantly non-crystalline dielectric material will be formed. The supporting substrate 101 may be a semiconductor substrate, a glass substrate, or may be a polymeric substrate. The supporting substrate 101 may include useful structures and electronic devices. These useful structures and devices (not shown for clarity) may include but not limited to transistors, resistors, capacitors, inductors, sensors, through vias, metal interconnects, and any isolation structures therein. The isolation region 102 provides a thermal isolation of the predominantly non-crystalline dielectric material from the substrate 101. The isolation region 102 is made from a high-temperature compatible material such silicon oxide, silicon nitride, aluminum oxide, aluminum nitride, boron nitride, or a combination thereof. The material of isolation region 102 preferably has a low thermal conductivity and diffusivity. In some embodiments, the vertical and lateral dimensions of the region 102 are selected to provide a suitable thermal isolation during nanosecond-scale annealing and are detailed later. The substrate 101 may also contain a bottom electrode layer 103 formed on top of the isolation layer 102. The bottom electrode layer 103 may contain a semiconductor or a metallic material depending on the application. Suitable semiconductor material of layer 103 includes SiC, Si, and SiGe. Suitable metallic material of layer 103 includes TiN, TaN, Ti, Ta, Co, W, Pt, Rh, Ir, and Ru. The predominantly non-crystalline dielectric material 104, which includes a type IV transition metal, is formed over the bottom electrode 103. The term "type IV transition metal" denotes the group of naturally occurring elements in group 4 of the periodic table, i.e. the group of titanium (Ti), zirconium (Zr), and hafnium (Hf). In some instances, the predominantly non-crystalline dielectric material 104 is an oxide, e.g., hafnium oxide ($HfO_2$), zirconium oxide ($ZrO_2$), and a combination thereof. In some embodiments, the predominantly non-crystalline dielectric material 104 is covered or confined with the top electrode 105. The top electrode layer 105 may contain a semiconductor or a metallic material depending on the application. Suitable semiconductor material of layer 105 includes SiC, Si, and SiGe. Suitable metallic material of layer 105 includes TiN, TaN, Ti, Ta, Co, W, Rt, Rh, Ir, and Ru. The electrodes 103 and 105 do not need to be the same size and do not need to be fully aligned with the dielectric material 104 and may extend passed the each other edges in different directions to allow for forming side contacts. Optional sidewall spacers (not shown) can be disposed along the edges of the material stack 103/104/105.

In some embodiments, the predominantly non-crystalline dielectric material including the type IV transition metal 104 on a supporting substrate 101 and with electrodes 103, 105 may be a component of a microelectronic device having a micron scale. The microelectronic device may be a field effect transistor (FET). As used herein a "field effect transistor" is a transistor in which output current, i.e., source-drain current, is controlled by the voltage applied to the gate. A field effect transistor has three terminals, i.e., gate, source and drain. A "gate structure" means a structure used to control output current (i.e., flow of carriers in the channel) of a semiconducting device through electrical or magnetic fields, and includes a gate dielectric and at least one gate electrode. As used herein, a "gate dielectric" is a layer of an insulator between the semiconductor device substrate of a planar device, or fin structure, and the gate conductor. In some embodiments, the predominantly non-crystalline dielectric material including the type IV transition metal 104 that is converted to a crystalline crystal structure by the present method may provide a high-k gate dielectric layer for the gate dielectric of a gate structure to a field effect transistor, such as a FinFET. Either electrodes 103 or 105 may serve as the gate electrode while the remaining electrode may serve as the channel and may be comprised of a semiconducting material. In the embodiments, in which the field effect transistor (FET) is a ferroelectric device, such as a ferroelectric field effect transistor (FeFET), the predominantly non-crystalline dielectric material 104 including the type IV transition metal that is converted to a ferroelectric material by the present method may provide the ferroelectric element of the ferroelectric field effect transistor (FeFET).

In another embodiment, the microelectronic device may be a metal insulator metal (MIM) capacitor. A "capacitor" is a structure including two electrically conductive materials separated and insulated from each other by a dielectric for storing a charge. The term "electrode" as used to describe a component of the capacitor represents one of the two electrically conductive materials of the capacitor that are separated by the dielectric layer. A "node dielectric layer" is the dielectric layer that is present between the electrodes of the capacitor. In some embodiments, the predominantly non-crystalline dielectric material including the type IV transition metal 104 that is converted to a crystalline crystal structure by the present method may provide a high-k gate dielectric layer for the node dielectric layer of the capacitor, such as the MIM capacitor. Electrodes 103 or 105 may serve as the respective electrodes in the MIM structure and are preferably comprised of a metallic material.

In another embodiment, the microelectronic device may be a memory device. As used herein, the term "memory device" means a structure in which the electrical state can be altered and then retained in the altered state, in this way a bit of information can be stored. For example, the memory device may be a dynamic random access memory (DRAM) device. A DRAM refers to a memory device wherein a basic cell is provided with a selection transistor and a capacitor. A gate of the selection transistor is connected to a word line, a drain thereof is connected to a bit line, and a source thereof is connected to an electrode or the capacitor. A gate of the selection transistor is connected to a word line, a drain thereof is connected to a bit line, and a source thereof is connected to an electrode or the capacitor that is, to an earthed electrode. In some embodiments, the predominantly non-crystalline dielectric material including the type IV transition metal 104 that is converted to a crystalline crystal structure by the present method may provide a high-k gate dielectric layer for the node dielectric layer of the capacitor of the DRAM cell. In some embodiments, the predominantly non-crystalline dielectric material including the type IV transition metal 104 that is converted to a crystalline crystal structure by the present method may provide a high-k gate dielectric layer for the gate dielectric of a field effect transistor (FET) that provides the access transistor to the DRAM cell. In some embodiments, when the memory device includes a ferroelectric element, such as in a ferroelectric random access memory devices (FERAM), the predominantly non-crystalline dielectric material including the type IV transition metal 104 that is converted to a ferroelectric material by the present method may provide the ferroelectric element of the memory device.

It is noted that the above examples are provided for illustrative purposes only, and it is not intended to limit the present disclosure to only these examples. Any microelectronic device that employs a predominantly non-crystalline dielectric material including the type IV transition metal that is converted to a crystalline and/or ferroelectric material may be suitable for the methods described herein. For example, the microelectronic devices can also include neuromorphic circuits, steep-slope low-power logic or energy storage applications.

The microelectronic device including the predominantly non-crystalline dielectric material including the type IV transition metal 104 that is to be converted to a crystalline crystal structure and/or ferroelectric material, the isolation structure 102, the top and bottom electrodes 103, 105 are preferably formed during back end of the line processing (BEOL). In some examples, the predominantly non-crystalline dielectric material including the type IV transition metal 104 that is converted to a crystalline crystal structure may be deposited using chemical vapor deposition (CVD). Chemical vapor deposition (CVD) is a deposition process in which a deposited species is formed as a result of chemical reaction between gaseous reactants at greater than room temperature (25° C. to 450° C.); wherein solid product of the reaction is deposited on the surface on which a film, coating, or layer of the solid product is to be formed. Variations of CVD processes include, but not limited to, Atmospheric Pressure CVD (APCVD), Low Pressure CVD (LPCVD) and Plasma Enhanced CVD (PECVD), Metal-Organic CVD (MOCVD) and combinations thereof may also be employed.

In some examples, the predominantly non-crystalline dielectric material including the type IV transition metal 104 that is converted to a crystalline crystal structure may be deposited using atomic layer deposition (ALD) or plasma-enhanced atomic layer deposition (PEALD). Atomic Layer Deposition (ALD) uses self-limiting surface reactions to deposit material layers in the monolayer or sub-monolayer thickness regime. ALD is similar in chemistry to chemical vapor deposition (CVD), except that the ALD reaction breaks the CVD reaction into two half-reactions, keeping the precursor materials separate during the reaction. In some embodiments, the atomic layer deposition (ALD) process may be a thin film deposition method in which a film is grown on a substrate by exposing its surface to alternate gaseous species (typically referred to as precursors). In contrast to chemical vapor deposition, the precursors are never present simultaneously in the reactor, but they are inserted as a series of sequential, non-overlapping pulses. In each of these pulses the precursor molecules react with the surface in a self-limiting way, so that the reaction terminates once all the reactive sites on the surface are consumed. In some embodiments, the monolayer deposition provided by the atomic layer depositions mechanisms provides that the layer be conformal.

In some examples, the top and bottom electrodes 103, 105 may be deposited by physical vapor deposition (PVD), i.e., sputtering, chemical vapor deposition (CVD), atomic layer deposition (ALD), electroplating, or a combination thereof. Preferably, these deposition techniques are made compatible with BEOL processing. The respective shapes of electrodes 103, 105 and the predominantly non-crystalline dielectric layer 104 can be defined by known patterning techniques such as photolithography (PHOTO), etching including reactive ion etching (RIE) or wet chemical etching (WET), and chemical-mechanical polishing (CMP). The individual shapes of each of the layers 103, 104, 105 can be defined separately using a dedicated photolithographic mask and a suitable etching or polishing process.

The isolation structure 102 may be formed by depositing a high-temperature compatible material such silicon oxide, silicon nitride, aluminum oxide, aluminum nitride, boron nitride, or a combination thereof using chemical vapor deposition (CVD) or its variations, atomic layer deposition (ALD), or a combination thereof. Variations of CVD processes include, but not limited to, Atmospheric Pressure CVD (APCVD), Low Pressure CVD (LPCVD) and Plasma Enhanced CVD (PECVD), High Density Plasma CVD (HDP CVD), Metal-Organic CVD (MOCVD). Preferably, these deposition techniques are made compatible with BEOL processing. The shape of isolation structure and 102 can be defined by known patterning techniques such as photolithography (PHOTO), etching including reactive ion etching (RIE) or wet chemical etching (WET), and chemical-mechanical polishing (CMP).

In some embodiments, the predominantly non-crystalline dielectric material including the type IV transition metal 104 may be deposited to a thickness that ranges from 1 nm to 15 nm. In one example, the predominantly non-crystalline dielectric material including the type IV transition metal 104 has a deposited thickness that is 5 nm or less.

In some preferred embodiments, the predominantly non-crystalline dielectric material including the type IV transition metal may have a composition that is pure hafnium oxide ($HfO_2$). The pure hafnium oxide composition is 100 wt. % hafnium oxide. In other preferred embodiments, the predominantly non-crystalline dielectric material including the type IV transition metal may be predominantly non-crystalline forms of hafnium oxide ($HfO_2$) and/or zirconium oxide ($ZrO_2$), including mixtures, nanolaminates, or multi-layers thereof.

In some embodiments, the non-crystalline dielectric material including the type IV transition metal may be doped. For example, the non-crystalline dielectric material including the type IV transition metal may be hafnium oxide ($HfO_2$) that is doped with aluminum (Al), yttrium (Y), lanthanum (La), carbon (C), nitrogen (N), or other suitable elements, or combinations, mixtures, nanolaminates, or multilayers thereof.

Following the formation of the predominantly non-crystalline dielectric material including the type IV transition metal 104, the method continues with converting the predominantly non-crystalline dielectric material including the type IV transition metal to a crystalline crystal structure via high-temperature nanosecond-scale, microsecond-scale, and/or millisecond-scale anneals.

In some embodiments, millisecond-scale flash annealing may be employed for converting, e.g., recrystallizing, the predominantly non-crystalline dielectric material including type IV transition metals 104 into a crystalline crystal structure and/or ferroelectric material. As used herein, the term "flash annealing" denotes an annealing method that employs flash lamps to induce heat in the surface being treated. A flash lamp is a device that emits radiation from a gaseous electrical discharge. A flash lamp includes an electrical storage device such as an array of high-voltage capacitors, a gaseous lamp, and control means such as high-voltage switches and/or transistors to quickly release the stored electrical energy into the lamp inducing gaseous electrical discharge and intense radiation. Due to various inertia phenomena associated with high-power gaseous electrical discharges and high-voltage switches and circuits, the duration of radiation flashes is limited to above about 100 microseconds. The flash lamp emits radiation over a broad range of frequencies typically in the visible band of electromagnetic spectrum. The spectral composition of flash lamp radiation depends on a specific gas mixture employed in the flash lamp. Typical flash lamp gas includes a noble gas such Xeon, Argon, or Neon. Most common semiconductors such as silicon, germanium, or silicon germanium can absorb flash lamp radiation over the entire emitted spectrum but other materials such as metals can absorb only a portion of emitted radiation in the green, blue, and near-UV portion of spectrum. In some instances, an array of individual flash lamps is employed to provide a laterally uniform radiation exposure of entire substrate surface. The substrate is typically positioned underneath the flash lamps without any rigid clamping to allow for thermal expansion after exposure. In some instances, a substrate pre-heat system is provided at the wafer backside which often comprises of a conventional heater based on incandescent lamps or a hot plate. Flash annealing process is specified in terms of incident flash radiation intensity, radiation exposure duration at full width at half maximum (FWHM), and substrate preheat conditions. Often, an incident flash energy density is given rather than the incident intensity. In this case, the incident radiation intensity can be estimated by dividing the incident energy density by the flash exposure duration. Flash lamp annealing can be performed in various ambient conditions, i.e. vacuum or under a defined gaseous partial pressure.

Figure 2:
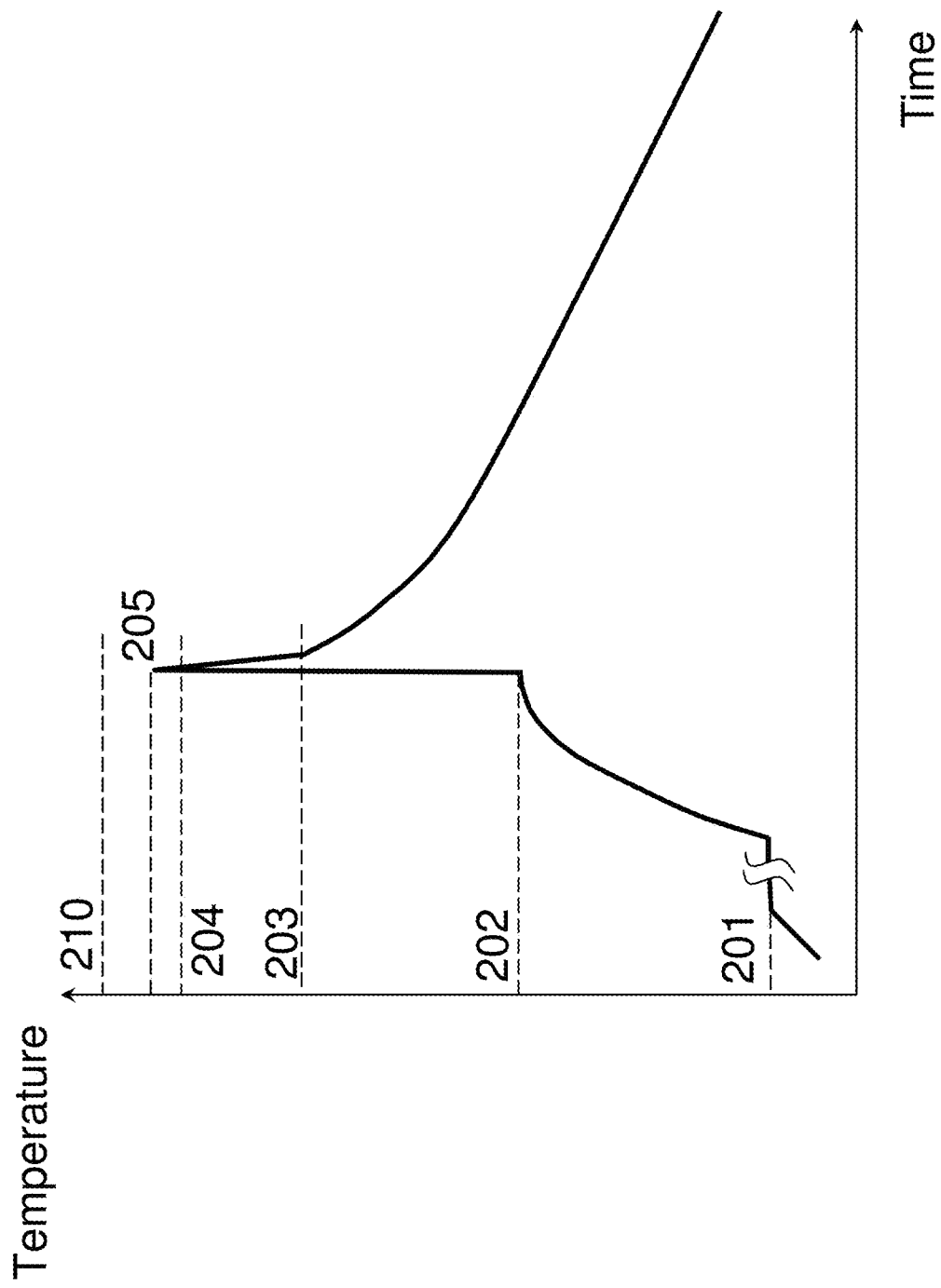
FIG. 2 is a representative temperature-time trace of the millisecond flash anneal process according to an embodiment of the present invention.

Flash lamp annealing allows a fast heating up of solid surfaces with a single light flash with a millisecond duration. FIG. 2 shows a representative temperature-time trace of the millisecond flash anneal process. The temperature level 201 is the temperature at which substrate is fully loaded into the flash lamp chamber. The temperature level 202 is the preheat or launch temperature to which the substrate is preheated utilizing conventional rapid thermal annealing, typically conducted through backside heating. Due to a relative slow backside heating at ramp rates of less than about 300° C./sec, the substrate temperature is nearly the same throughout the entire substrate thickness. The temperature level 205 is a surface peak surface temperature after front side exposure to the flash lamp radiation. Temperature swing or jump induced by the flash lamp exposure, the difference between temperature levels 202 and 205, increases with flash lamp intensity and flash radiation exposure duration. The temperature ramp up rate from level 202 to level 205 ranges from about 10,000° C./sec to about 1,000,000° C./sec. Short frontside flash exposure causes a nonuniform substrate heating leading to a higher temperature at or near the substrate surface and a low temperature in the substrate interior and backside. The heat penetration depth into substrate interior defines a substrate portion where the temperature is raised in response to the flash radiation exposure. Such heat penetration depth scales as a square root of the product of the radiation exposure duration and the substrate thermal diffusivity and is about 200 microns for 1 millisecond exposure in Si substrates and about 50 microns for 1 millisecond exposure in glass ($SiO_2$) substrates. Flash lamp radiation exposure duration is from about 0.3 milliseconds to about 30 milliseconds and the heat penetration depth ranges from about 100 microns to about 1 millimeter in silicon substrates and from about 25 microns to about 250 microns in glass substrates. After flash lamp radiation exposure, the front surface of the substrate cools quickly by redistributing the heat within the substrate and, then, cools slowly by dissipating the heat to the ambient atmosphere by radiation or convection. This is reflected in the temperature trace as an inflection point in the cooling down cycle at the temperature level 203. The temperature difference between level 202 and 203 is determined by absorbed flash lamp energy dispersed evenly across the substrate thickness and is proportional to the temperature difference between levels 202 and 205 (the temperature swing induced by the flash lamp) multiplied by the ratio of the heat penetration depth to the total substrate thickness. In the case of a standard 780-micron-thick 300 mm Si substrate and 440 microns heat penetration depth, the temperature difference between level 202 and 203 is roughly equal to one quarter of the temperature swing induced by the flash lamp. The temperature ramp down rate ranges from about 3,000° C./sec to about 300,000° C./sec from level 205 to level 203 and from about 100° C./sec to about 10° C./sec below the level 203. The anneal duration measured at level 204, typically 50° C. below the temperature level 205, ranges from about 200 microseconds to about 20 milliseconds.

Figure 3:
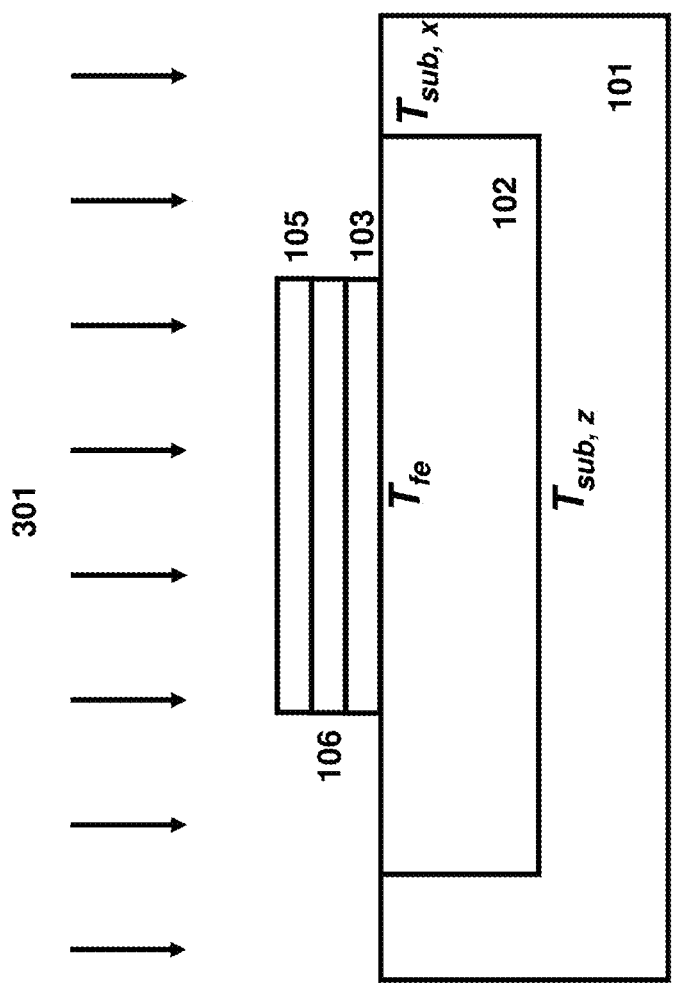
FIG. 3 is a cross-sectional diagram illustrating a thermally isolated metal-dielectric-metal stack of FIG. 1 having been subjected to a millisecond flash anneal process, according to an embodiment of the present invention.

The process of converting, e.g., recrystallizing, the predominantly non-crystalline dielectric material including type IV transition metals 104 into a crystalline crystal structure and/or ferroelectric material by flash annealing is shown in FIG. 3. The flash lamp radiation 301 is coupled into substrate 101 and material stack 103/104/105 causing its temperature to raise to the levels labeled $T_{fe}$ for the predominantly non-crystalline dielectric material including type IV transition metals 104 and $T_{sub,z}$ and $T_{sub,x}$ for the adjacent points of substrate 101 located vertically and horizontally, respectively, at a boundary between the thermal isolation structure 102 and the substrate 101. The micron-scale of structure 102 is much shorter than the heat penetration depth causing these temperature levels to be approximately same and within ten's of degrees. In order to initiate the conversion of the predominantly non-crystalline dielectric material including type IV transition metal 104 into a crystalline phase, the $T_{fe}$ temperature should exceed a certain threshold. Further, the anneal duration shall be long enough to complete the conversion of material 104 into a crystalline phase. Opposite to conventional rapid thermal annealing, the millisecond-scale annealing fully converts dielectric material 104 into a crystalline phase at a much higher temperature. Such high temperature may cause degradation of useful structures present in substrate 101. Further, such high temperature may cause stabilization of tetragonal or cubic phases that are energetically more favorable at high temperatures. In some embodiments, the conversion step is typically performed during back end of the line (BEOL) processing and/or after BEOL processing. The peak surface temperature is limited by temperature-sensitive BEOL interconnect structures and transistor gate stack structures and is typically below about 1000° C. for millisecond-scale anneals as alluded above. This upper limit is shown schematically in FIG. 2 as the temperature level 210. In addition, the thermal budgets of conventional rapid thermal anneals and/or furnace anneals, as described previously, when used to convert a predominantly non-crystalline dielectric material including type IV transition metals 104 to a crystalline and/or ferroelectric phase also degrade the previously formed FEOL and BEOL useful features and devices. This limits the maximum temperature of RTA processes to below about 500° C. and furnace processes to below about 400° C. resulting in either inability to crystallize the dielectric material 104 or a degraded reliability of metallic interconnects and/or a degraded transistor and interconnect performance. In some embodiments, the flash annealing parameters are selected to yield the peak temperature level 205 to be below the damage threshold 210 and preferably in the range of from about 600° C. to about 1000° C., the temperature level 202 to be below about 400° C., and the temperature level 203 to be below about 550° C. In one example, this can be accomplished by selecting flash incident energy density from about 10 $J/cm^2$ to about 100 $J/cm^2$ and radiation exposure duration from about 0.5 to 30 milliseconds. It is customary to specify the process duration of ultra-short anneals in terms of the radiation exposure duration at FWHM rather than the anneal duration at the temperature level 204 or 50° C. below the peak temperature. These duration quantities are related to each other and, in some embodiments, the anneal duration at the temperature level 204 is a fraction (e.g. about ⅓) of the radiation exposure duration. The resultant film 106 is fully crystallized and contains a ferroelectric phase such as the polar orthorhombic phase of space group $Pca2_1$ or $Pmn2_1$. Without providing any limitation, the crystalline grain nucleation occurs at near the peak temperature but the full conversion into crystalline state does not need to be fully completed at the high temperature. Short duration at high-temperature helps maintaining and growing small crystalline nuclei in the metastable ferroelectric phase preventing its spontaneous conversion into more stable non-polar phases such as monoclinic, tetragonal, or cubic phases. Optionally, the crystal grain growth can be fully completed during the slow cooling down cycle at or below temperature level 203. The temperature level 203 is low enough for preserving the metastable ferroelectric phase.

In some embodiments, laser annealing may be employed for converting, e.g., recrystallizing, the predominantly non-crystalline dielectric material including type IV transition metals 104 into a crystalline crystal structure and/or ferroelectric material. As used herein, the term "laser annealing" denotes an annealing method that employs a laser to induce heat in the surface being treated. A laser is an electro-optical device that emits coherent radiation. In some embodiments, a typical laser emits light in a narrow, low-divergence beam and with a defined wavelength. In some instances, the advantages of employing laser for annealing processes is that its light can be easily shaped and focused onto a specific area of the annealing surface to achieve very high radiation intensity with short exposure durations. One particular advantage of laser annealing is that it overcomes the flash annealing limitations extending annealing durations to shorter than 300 microseconds and temperature swings to above 500-600° C. range.

In some embodiments, the short exposure duration is achieved by raster scanning focused laser beam over the substrate surface. In this case, the exposure duration measured at incident intensity FWHM is the beam width in the scanning direction divided by the scanning velocity. In alternative embodiments, the short exposure duration is achieved by employing a pulsed laser. In this case, the laser beam is shaped to achieve a required peak intensity over a selected substrate area such as over an entire product die and the laser is operated in a pulsed mode such as in the case of Q-switched laser. The pulse duration of Q-switched laser at intensity FWHM determines the substrate exposure time. The exposure process is repeated for all predominantly non-crystalline dielectric materials including type IV transition metals in a step-and-repeat approach. In some embodiments, the exposure to light, i.e., by laser annealing, e.g., application of the laser beam, includes 1 pulse to 100 pulses of light exposure.

In some embodiments, the laser type that is employed in the laser annealing method is selected from a far-infrared $CO_2$ laser emitting at 10,600 nm, a solid-state Nd:YAG laser emitting at 1064 nm, or a solid-state laser diode array emitting in a 780 nm-1,000 nm band. In some embodiments, the laser type that is employed in the laser annealing method is selected from an excimer laser emitting at below 400 nm, a frequency-doubled or -tripled solid-state Nd:YAG laser emitting at 532 nm or 355 nm, respectively. Excimer lasers can be powered by a chemical reaction involving an excited dimer, or excimer, which is a short-lived dimeric or heterodimeric molecule formed from two species (atoms), at least one of which is in an excited electronic state. Commonly used excimer molecules include $F_2$ (fluorine, emitting at 157 nm), and noble gas compounds (ArF (193 nm), KrCl (222 nm), KrF (248 nm), XeCl (308 nm), and XeF (351 nm)). Excimer lasers are usually operated in a Q-switched, pulsed mode suitable for step-and-repeat pulsed wafer exposure. Solid-state Nd:YAG lasers provide an alternative to excimer lasers due to its stable, high-power output at 1,064 nm that can be efficiently frequency doubled or tripled emitting radiation at 532 nm or 355 nm. Solid state lasers can be configured in continuous, pulsed, or Q-switched pulsed modes suitable for both raster scanning and step-and-repeat pulsed operation.

Some examples of laser annealing systems that can produce the anneal temperatures and millisecond scale anneal durations that are suitable for converting, e.g., recrystallizing, the predominantly non-crystalline dielectric material including type IV transition metals into a crystalline crystal structure and/or ferroelectric material include commercially available Laser Spike Annealing (LSA™) based on scanning far-infrared $CO_2$ laser emitting at 10,600 nm with an optional second scanning beam based on solid-state laser diode array emitting in a 780 nm-1000 nm or Dynamic Surface Annealing (DSA™) based on scanning on solid-state laser diode array emitting in a 780 nm-1000 nm, and combinations thereof.

Some other examples of laser annealing systems that can produce the anneal temperatures and nanosecond-scale anneal durations that are suitable for converting, e.g. recrystallizing, the predominantly non-crystalline dielectric material including type IV transition metals into a crystalline crystal structure and/or ferroelectric material include commercially available nanosecond laser systems based on Q-switched solid-state Nd:YAG lasers or XeCl excimer lasers or dual-beam nanosecond laser systems based on a 1st scanning laser beam with nanosecond-scale substrate exposure based on continuous-wave solid-state Nd:YAG lasers and a 2nd scanning laser beam with millisecond-scale substrate exposure based on continuous-wave solid-state laser diode arrays emitting in a 780 nm-1000 nm.

The laser wavelength is selected to couple its beam into the substrate 101 and/or material stack 103/104/105 and to minimize any contrast or pattern effects that may exist due to the presence of dissimilar microstructures on the surface being heated. In some embodiments, longer laser wavelength (e.g. longer than 500 nm) may be employed to minimize contrast or pattern effects and shorter laser wavelength (e.g. shorter than 1100 nm) may be employed to improve coupling into and absorption by the substrate 101 and even shorter laser wavelength (e.g. shorter than 600 nm) may be employed to improve coupling into and absorption by the stack 103/104/105. These opposing tasks of selecting laser wavelength could be reconciled by employing a dual beam system where one beam can have a longer wavelength and the other beam can have a shorter wavelength.

Figure 4:
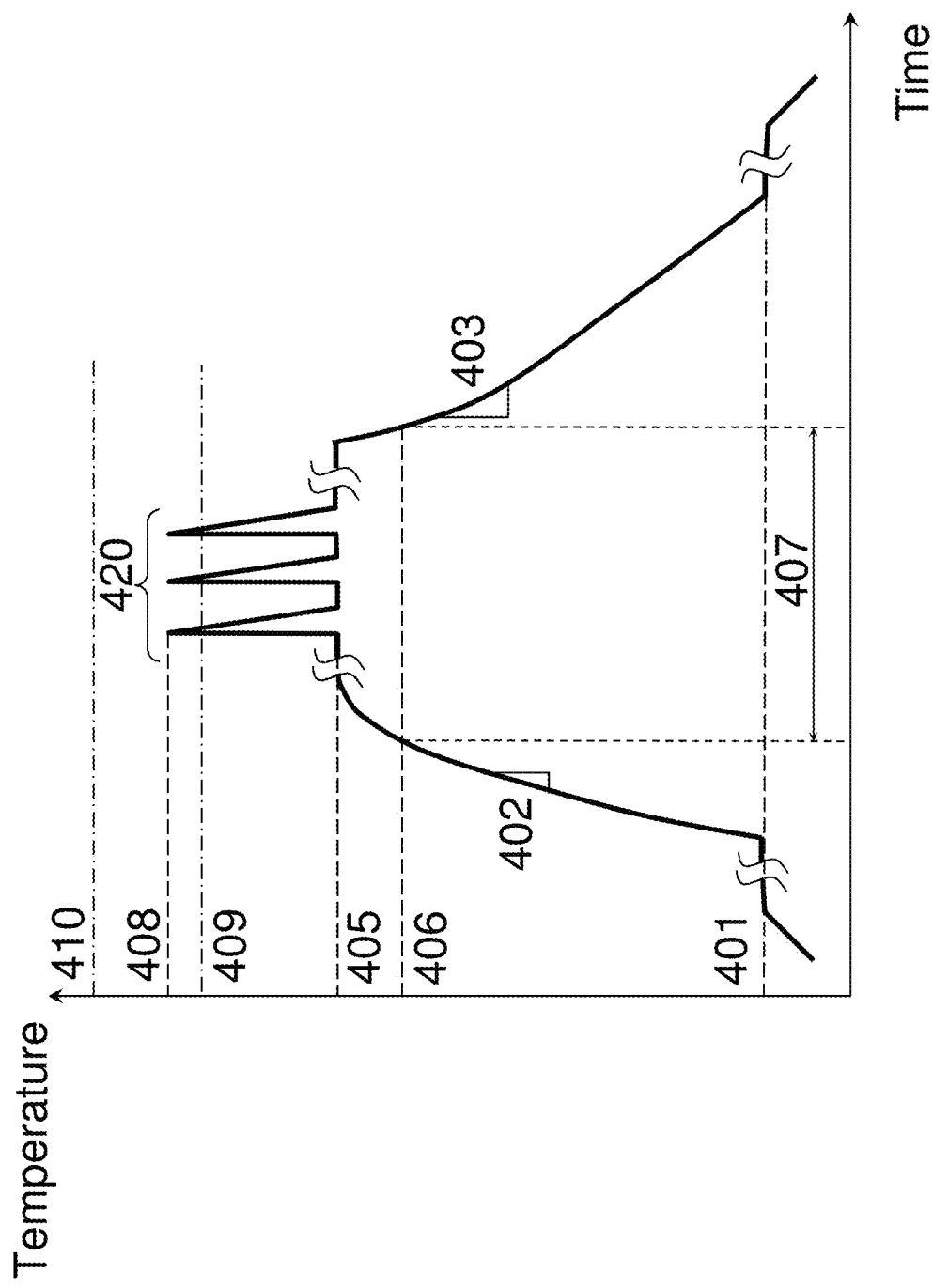
FIG. 4 is a representative temperature-time trace of the nanosecond laser anneal process according to an embodiment of the present invention.

Once the substrate 101 with the predominantly non-crystalline dielectric material including type IV transition metal 104 is exposed to the laser radiation either through raster scanning or through a laser pulse, its surface temperature begins raising from its base value and falls shortly after. FIG. 4 shows a representative temperature-time trace of the dual-beam nanosecond laser anneal process. Initial substrate temperature is show by the level 401 and is within the range of from 23° C. (room temperature) to 400° C. The temperature level 401 is set by a hot plate on which the substrate 101 resides. The first laser beam having wavelength at near 800 nm raises the surface temperature of substrate 101 from the level 401 to the level 405 with the temperature ramp up rate 402 of from about 50,000° C./sec to about 5,000,000° C./sec. The second laser beam having wavelength at near 532 nm raises the surface temperature of substrate 101 from the level 405 to the level 408 with the ramp up rate from about 1,000,000,000° C./sec to about 100,000,000,000° C./sec or about 20,000 times faster than the ramp rate 402. After peaking at the level 408, the surface temperature of substrate 101 quickly drops back to the level 405 with the temperature ramp down rate of from about 300,000,000° C./sec to about 30,000,000,000° C./sec. The anneal duration measured at the level 409, typically 50° C. below the temperature level 408, ranges from about 1 nanosecond to about 500 nanoseconds. Several temperature pulses 420 can be accommodated in one preheat cycle due to their shortness. After conducting nanosecond-scale temperature anneal pulses 420, the pre-heat cycle ends and the surface temperature of substrate 101 drops from the level 405 to the level 401 with the ramp down rate 403 of from about 10,000° C./sec to about 3,000,000° C./sec. The preheat duration 407 measured at the temperature level 406, typically 50° C. below the temperature level 405, ranges from about 100 microseconds to about 10 milliseconds. Multi-pulse nanosecond-scale annealing can be conducted in one preheat cycle as shown in FIG. 4 or, alternatively, by applying the entire anneal cycle to the same spot of substrate 101 several times. In the case on multi-pulse or multi-cycle processing, the cumulative nanosecond and millisecond anneal duration is defined as the total time spent at or above the temperature levels 409 and 406, respectively. For example, an anneal with two nanosecond-scale pulses applied to the same spot of substrate 101 three times has the cumulative nanosecond anneal duration six times longer than the anneal duration of individual pulse and the cumulative millisecond anneal duration three times longer than the duration of a single pre-heat cycle.

Laser-induced surface temperature rise is set by the laser incident radiation intensity, laser pulse or exposure duration, and substrate 101 thermal and optical properties. Short frontside laser exposure causes a nonuniform substrate heating. The heat penetration depth in the case of millisecond-scale laser pre-heat cycle is similar to that of flash annealing and ranges from about 100 microns to about 1 millimeter in silicon substrates and from about 25 microns to about 250 microns in glass substrates. The heat penetration depth in the case of nanosecond-scale laser pulses is much smaller and ranges from about 500 nanometers to about 5 microns in silicon substrates and from about 100 nanometers to about 1 micron in glass substrates. After laser radiation exposure, the front surface of the substrate cools quickly by redistributing the heat within the substrate and the hot plate to which the substrate is often clamped to. The heat redistribution and cooling is very efficient in the case of laser annealing due to a smaller heated volume as compared to that of flash annealing causing a fast cool down over the entire temperature range.

FIG. 4 may also illustrate representative temperature traces of single beam millisecond and nanosecond laser annealing processes. For single beam millisecond laser annealing processes, the nanosecond temperature pulses 420 are absent and the level 405 becomes the peak temperature level. For single beam nanosecond laser annealing processes, the millisecond pre-heat cycle is absent and the nanosecond temperature pulses 420 are initiated directly from the temperature level 401. Although the shape of temperature trace of FIG. 4 resembles that of FIG. 2, the rough scale of the time axis in FIG. 4 is about 10,000 times shorter than that in FIG. 2.

Figure 5:
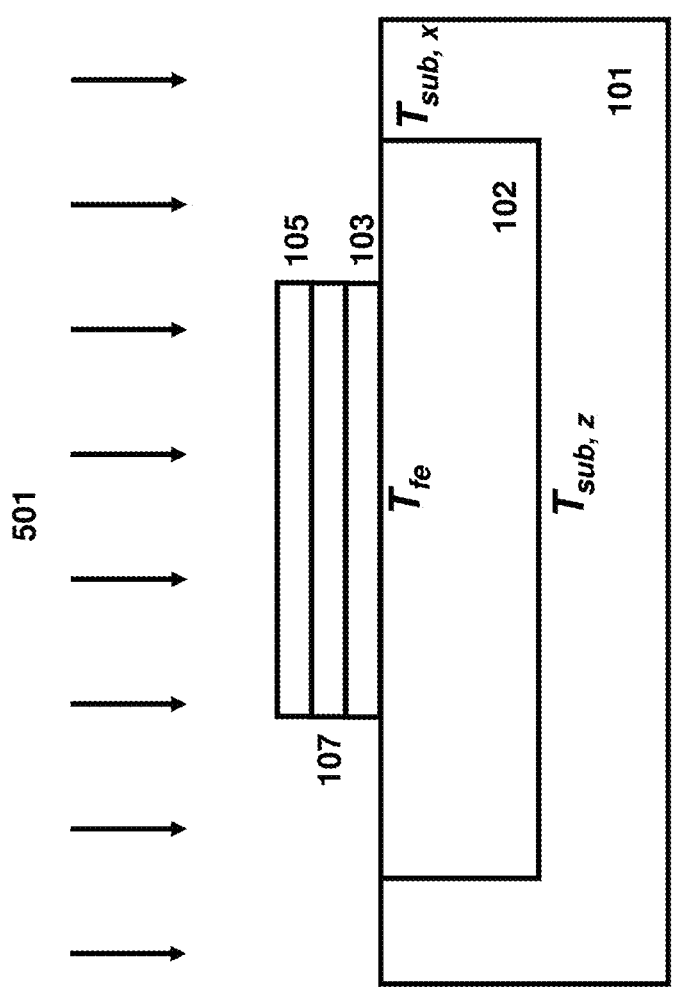
FIG. 5 is a cross-sectional diagram illustrating a thermally isolated metal-dielectric-metal stack of FIG. 1 having been subjected to a nanosecond laser anneal process, according to an embodiment of the present invention.

The process of converting, e.g., recrystallizing, the predominantly non-crystalline dielectric material including type IV transition metals 104 into a crystalline crystal structure and/or ferroelectric material by laser annealing is shown in FIG. 5. The laser radiation 501 is coupled into substrate 101 and material stack 103/104/105 causing its temperature to raise to the levels labeled $T_{fe}$ for the non-crystalline dielectric material including type IV transition metals 104 and $T_{sub,z}$ and $T_{sub,x}$ for the adjacent points of substrate 101 located vertically and horizontally, respectively, at a boundary between the thermal isolation structure 102 and the substrate 101. Similar to flash lamp annealing, these temperatures are approximately same and within ten's of degrees for millisecond laser annealing processes including millisecond pre-heat cycles. For nanosecond laser annealing processes, the temperature $T_{fe}$ can be substantially different than the temperatures $T_{sub,z}$ and $T_{sub,x}$. Advantageously, the temperature $T_{fe}$ can be made substantially higher than $T_{sub,z}$ and $T_{sub,x}$ by making the isolation structure 102 to be approximately one quarter of heat penetration depth in material 102 or thicker, by laterally separating edges of material stack 103/104/105 from substrate 101 and its temperature sensitive structures by approximately one quarter of heat penetration depth in material 102 or larger, and by coupling laser energy directly into the material stack 103/104/105. The latter is accomplished by making at least one of the electrodes 103 or 105 to be absorbent to the incident nanosecond-scale laser radiation. In one example, the wavelength of laser radiation for nanosecond pulses is selected to be shorter than about 600 nm and the metallic electrodes are selected to be thicker than about 10 nm to couple and absorb most of the incident laser radiation into and by the metallic material present in electrodes 103/105. The energy absorbed by electrodes 103/105 and the efficient thermal insulation provided by structure 102 causes the temperature of material stack 103/104/105, $T_{fe}$, to be substantially higher than the adjacent substrate temperatures $T_{sub,z}$ and $T_{sub,x}$. Stating it differently, the temperature-time trace for the material stack 103/104/105 will have a higher level 408 than that of substrate 101 while the level 405 will be similar for both. In one example, the isolation structure 102 is made of silicon oxide ($SiO_2$) and its thickness is selected to be 90 nm or about one quarter of heat penetration depth in silicon oxide for 60-ns radiation pulse duration. This causes the difference between temperature levels 408 and 405 for the stack 103/104/105 to be about 35% larger than that for the substrate 101. Other thermal insulation materials such as silicon nitride ($Si_3N_4$), aluminum oxide ($Al_2O_3$), aluminum nitride (AlN), boron nitride (BN), or a combination thereof can be used for isolation 102, and the preferred thickness of isolation 102 as well as the preferred lateral separation provided by isolation 102 can be deduced by requiring that these quantities to be equal or larger than about one quarter of the heat penetration depth in these materials for employed radiation duration, as measured at its full width half maximum (FWHM).

In order to initiate the conversion of the predominantly non-crystalline dielectric material including type IV transition metals 104 into a crystalline phase, the $T_{fe}$ temperature should exceed a certain threshold. Further, this threshold depends on the anneal duration because the anneal duration shall be long enough to allow for forming crystalline nuclei and completing conversion of the material 104 into a crystalline phase via crystalline grain growth. Millisecond laser annealing has a temperature threshold for crystallizing material 104 similar to that of flash lamp annealing. This threshold can be prohibitively high for previously formed FEOL and BEOL useful features and devices degrading their reliability and/or performance. Similar to flash annealing, in some embodiments, the millisecond laser annealing parameters are selected to yield the peak temperature level 405 to be below the damage threshold of previously formed FEOL and BEOL features and devices and preferably in the range of from about 700° C. to about 1000° C. and the temperature level 401 to be below about 400° C. In one example, this can be accomplished by selecting millisecond laser incident power density from about 3 kW/cm$^2$ to about 50 kW/cm$^2$ and laser radiation exposure duration from about 0.2 to about 10 milliseconds. The radiation exposure duration measured at FWHM and the annealing duration measured at the temperature level 406 are related to each other and, in some embodiments, the anneal duration at the level 406 is a fraction (e.g. about ⅓) of radiation exposure duration. The full conversion into the crystalline state does not need to be fully completed at the high temperature, only the crystalline nuclei need to be formed. Optionally, additional anneals can be conducted to complete the conversion by growing grains from the nuclei. These additional anneals are limited to below 500° C. for second-scale durations and below 900° C. for millisecond scale durations. The resultant film 107 is fully crystallized and contains a metastable ferroelectric phase such as the polar orthorhombic phase of space group $Pca2_1$ or $Pmn2_1$.

Opposite to millisecond-scale laser annealing, the nanosecond-scale laser annealing is not expected to convert the predominantly non-crystalline dielectric material 104 into a crystalline phase until its temperature reaches the melting point of material 104. This is due to a limited ability for the collective motion of atoms in the solid state phase for durations of 100 nanoseconds or less, which is required for crystallite nucleation and growth. The melting points of $HfO_2$ and $ZrO_2$ are 2760° C. and 2715° C., respectively. These extreme temperatures are far outside of any practical temperature range for typical substrates. Raising the temperature of these films to the vicinity of respective melting points (e.g. to within 500° C. of melting points) is also not practical. Forming crystalline nuclei in thinner dielectric films, especially, constrained by electrodes from both sides typically requires a higher thermal budget causing further shift of the crystalline nucleation threshold to higher temperatures. The damage threshold of previously formed FEOL and BEOL features and devices is at or below 1300° C. for nanosecond-scale durations. Annealing these structures at around 1300° C. or higher is causing severe interconnect reliability degradation making them practically unusable. This damage threshold is shown schematically in FIG. 4 as the temperature level 410. While the damage threshold is defined in terms of substrate temperatures $T_{sub,z}$ and $T_{sub,x}$, the temperature of material stack 103/104/105, $T_{fe}$, can be made higher than 1300° C. with a suitable thermal isolation structure 102, as alluded above. Raising $T_{fe}$ temperature to around 1700° C. while keeping $T_{sub,z}$ and $T_{sub,x}$ below 1300° C. would require the isolation thickness and the lateral separation to be about one quarter of the heat penetration depth in isolation material 102 or larger, or about 9 nm or larger for $SiO_2$ material 102 and radiation pulse duration of about 60 nanoseconds. Raising $T_{fe}$ temperature to substantially above 1700° C. is problematic because the melting point of $SiO_2$ material is 1710° C. Heating beyond reaching the melting point of supporting structure 102 may result in the loss of integrity. In addition, once the melting point of substrate surface is reached, it is hard to raise the surface temperature substantially over the melting point until most of material 102 is melted. This is because the extra heat is spent melting the material rather than raising the surface temperature. Alternative thermal isolation materials such as silicon nitride (melting point 1900° C.), aluminum oxide (melting point 2070° C.), aluminum nitride (2200° C.), and boron nitride (melting point 2975° C.), or a combination thereof can be used above 1710° C. however their thermal diffusivities are higher than that of $SiO_2$ causing the isolation structure to be larger. Furthermore, extreme temperatures may not be compatible with materials in electrodes 103/105 substantially narrowing down the choice of materials for entire electrode structure. In some embodiments where the electrodes 103/105 include a low melting point material such as a semiconducting material (e.g. silicon with its melting point of 1412° C.), the edges of the stack 103/104/105 may be sealed by the optional sidewall spacers preventing any escape of the liquefied material from the structure 103/104/105. Even though it is possible to melt some material of electrodes 103/105 for brief, nanosecond-scale periods, it is not desirable of significantly exceeding the melting point due to large volume changes causing a loss of structural integrity. It is therefore highly preferred to keep the temperature of material stack 103/104/105, $T_{fe}$, below about 1710° C. (the melting point of $SiO_2$) and to keep the isolation structure 102 as compact as possible.

In some embodiments, the nanosecond laser annealing parameters are selected to yield the peak temperature, $T_{fe}$, below about 1710° C. and preferably in the range of from about 1300° C. to about 1710° C., the substrate temperatures $T_{sub,z}$ and $T_{sub,x}$ below 1250° C., the millisecond preheat level 405 below about 600° C., and the temperature level 401 below about 400° C. In one example, this can be accomplished by selecting nanosecond laser incident energy density from about 0.1 $J/cm^2$ to about 3 $J/cm^2$, radiation exposure duration from about 5 to 200 nanoseconds, and the size of $SiO_2$ thermal isolation, including its thickness and the lateral separation from the substrate 101, to be larger than 50 nm and smaller than 200 nm. The radiation exposure duration measured at FWHM and the annealing duration measured at the temperature level 409 are related to each other and, in some embodiments, the anneal duration at the level 409 is a fraction (e.g. about ⅓) of radiation exposure duration. The resultant film 107 is fully or partially crystallized and contains a metastable ferroelectric phase such as the polar orthorhombic phase of space group $Pca2_1$ or $Pmn2_1$. The pure, 3.5 nm-thick, $HfO_2$ amorphous film 104, constrained by TiN electrodes from both sides, is fully crystallized at or below 1710° C. into film 107 containing a metastable ferroelectric phase such as the polar orthorhombic phase of space group $Pca2_1$ or $Pmn2_1$. Advantageously, individual nanosecond radiation pulses can be kept short (e.g. shorter than 200 nsec) to improve the efficiency and compactness of the isolation structure 102 but the number of nanosecond radiation pulses can be increased to allow for the crystalline grain nucleation and crystalline grain growth. Accordingly, the cumulative radiation exposure time can be made longer than 500 nanoseconds and preferably from about 500 nanoseconds to about 10 microseconds while keeping individual radiation pulse duration to below 200 nanoseconds. The cumulative radiation exposure duration and the cumulative annealing duration measured at the temperature level 409 are related to each other, as alluded above. This multi-pulse annealing allows for converting predominantly non-crystalline film 104 into crystalline film 107 at a lower peak temperature, converting predominantly non-crystalline film 104 containing dopants that shift the crystallization threshold to a higher temperature into crystalline film 107, and partially converting predominantly non-crystalline film 104 into the film 107 containing a mix of amorphous and crystalline phases. In the case of partial crystallization at a lower temperature, the number of nanosecond pulses can be used to adjust the degree of partial crystallization. The 8 nm-thick, aluminum-doped (5%) $HfO_2$ amorphous film 104, constrained by TiN electrodes from both sides, is fully crystallized at or below 1710° C. into film 107 containing a metastable ferroelectric phase such as the polar orthorhombic phase of space group $Pca2_1$ or $Pmn2_1$. Without providing any limitation, the crystalline grain nucleation occurs at near the peak temperature and each additional individual pulse at high temperature grow the nuclei. Ultra-short duration at high-temperature helps maintaining and growing initial small crystalline nuclei in the metastable ferroelectric phase preventing its spontaneous conversion into more stable non-polar phases such as monoclinic, tetragonal, or cubic phases. Optionally, additional anneals can be conducted to complete the conversion by growing grains from the nuclei. These additional anneals are limited to below 500° C. for second-scale durations and below 900° C. for millisecond scale durations. The resultant film 107 is fully or partially crystallized and contains a metastable ferroelectric phase such as the polar orthorhombic phase of space group $Pca2_1$ or $Pmn2_1$.

In alternative embodiments, the nanosecond laser annealing parameters are selected to yield the peak temperature, $T_{fe}$, below about 2000° C. and preferably in the range of from about 1300° C. to about 2000° C., the substrate temperatures $T_{sub,z}$ and $T_{sub,x}$ below 1250° C., the millisecond preheat level 405 below about 600° C., and the temperature level 401 to be below about 400° C. In one example, this can be accomplished by selecting the nanosecond laser incident energy density from about 0.1 $J/cm^2$ to about 3 $J/cm^2$, the radiation exposure duration from about 5 to 200 nanoseconds, and the material for the thermal isolation structure 102, directly adjacent to the material stack 103/104/105, from high-melting point materials such silicon nitride (melting point 1900° C.), aluminum oxide (melting point 2070° C.), aluminum nitride (2200° C.), and boron nitride (melting point 2975° C.), or a combination thereof, and the size of isolation structure, including its thickness and the lateral separation from the substrate 101, be larger than 100 nm and smaller than about 300 nm. The resultant film 107 is fully or partially crystallized and contains a metastable ferroelectric phase such as the polar orthorhombic phase of space group $Pca2_1$ or $Pmn2_1$.

Figure 6:
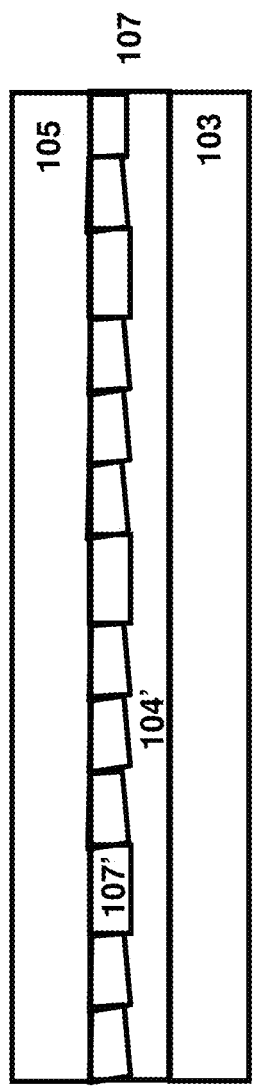
FIG. 6 is a cross-sectional diagram illustrating a resultant structure of metal-dielectric-metal stack after a nanosecond laser anneal process, according to an embodiment of the present invention.

FIG. 6. illustrates the resultant structure including bottom electrode 103, top electrode 105, and partially or fully crystallized dielectric film 107 including type IV transition metals. Crystalline portion of film 107 is shown as 107'. Crystalline portion 107' provides advantages of having a higher dielectric constant and exhibiting ferroelectric properties if crystallized into a metastable ferroelectric phase such as the polar orthorhombic phase of space group $Pca2_1$ or $Pmn2_1$. The remaining predominantly amorphous portion of film 107, if present, is shown as 104'. Presence of remaining predominantly amorphous phase 104' in the resultant structure can be beneficial in some applications because it provides improved reliability and endurance.

In some embodiments, the substrate 101 may include a temperature-sensitive polymer. The damage threshold of common polymers is below about 500° C. for nanosecond-scale durations. In this case, the isolation structure 102 can be made substantially thicker and wider, e.g. thicker and having a wider lateral separation from the polymer than the heat penetration depth in the isolation material 102, or thicker and having a wider lateral separation from the polymer than about 300 nm for $SiO_2$ material 102 and the radiation pulse duration of 100 nanoseconds or less.

While the annealing step for converting the predominantly non-crystalline dielectric material including type IV transition metals 104 into a crystalline phase has been described in terms of applying short bursts of light such as flash and laser annealing, other means of delivering and coupling short bursts of energy into the substrate 101 and/or the structure 103/104/105 can also be used as long as they enable the specified ranges of energy or power densities and the burst durations. Such other forms of delivering energy bursts into substrate surfaces may include electron beam, hot gas jet, plasma jet, and similar energetic beams.

After completing converting the predominantly non-crystalline dielectric material including type IV transition metals 104 into a crystalline phase, additional processing steps can be performed to form a variety of useful electronic devices and structures. This includes processing steps for forming or re-forming electrodes 103 and/or 105, processing steps for patterning, shaping, or re-shaping electrodes 103/105 and the converted layer 106 or 107, processing steps for electrically isolating electrodes 103/105 and encapsulating the converted layer 106 or 107, processing steps for forming electrical contacts to electrodes 103/105, processing steps for forming electrical wiring, and processing steps for encapsulating wired integrated circuits.

The methods described herein allows for a greater variety of materials available for BEOL device applications, e.g. memory devices, neuromorphic devices, decoupling capacitors, etc., and for allows for integration on heat-sensitive substrates such as polymers for flexible electronics.

The methods described herein can produce pure $HfO_2$ that can crystallize into a high-quality ferroelectric phase. The methods described herein can provide hafnium based films having a thickness that is less than 5 nm and can be crystallized into a ferroelectric (FE)phase. The anneal processes described herein that employ millisecond and/or nanosecond annealing with laser annealing and/or flash annealing can provide better results than what could be achieved with greater duration anneals employing rapid thermal annealing and/or furnace annealing.

The following examples are provided herein for illustrative purposes and to further detail some aspects of the present disclosure. The examples provided herein are not intended to limit the present invention to only these detailed examples.

EXAMPLES

Figure 7:
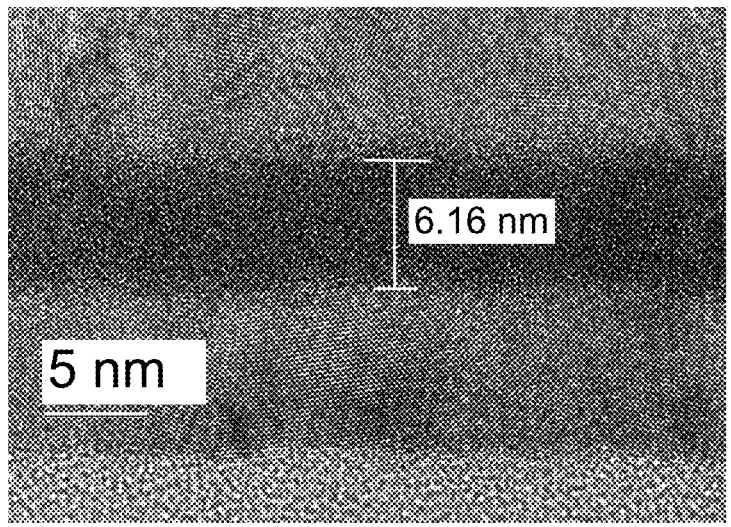
FIG. 7 is a transmission electron microscope (TEM) image of a layer stack from top to bottom of 30 nm TiN/20 nm TiN/6.8 nm $HfO_2$/10 nm TiN/90 nm $SiO_2$ on a Si wafer with $HfO_2$ grown by atomic layer deposition (ALD) at 250° C. and the layered stack is not annealed. The $HfO_2$ is predominantly non-crystalline.
Figure 8:
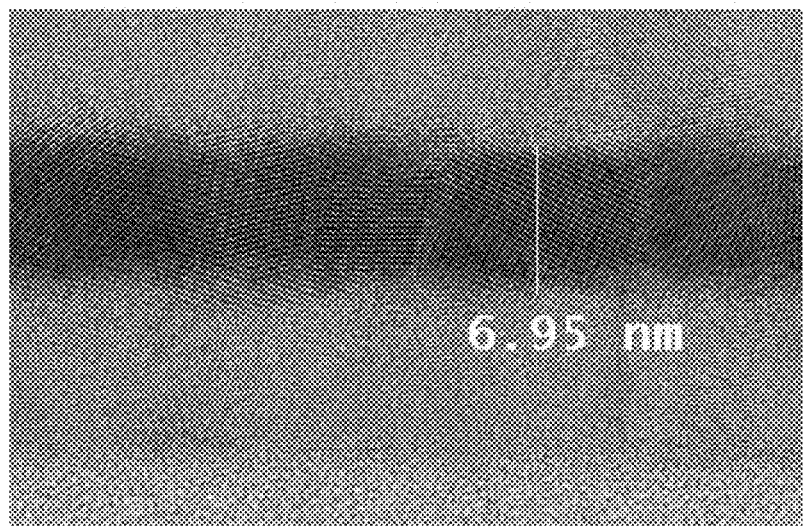
FIG. 8 is a TEM image of a layer stack from top to bottom of 30 nm TiN/20 nm TiN/6.8 nm $HfO_2$/10 nm TiN/90 nm $SiO_2$ on a Si wafer with $HfO_2$ grown by atomic layer deposition (ALD) at 250° C. wherein the stack was exposed to a single laser anneal after deposition of the 20 nm TiN layer, and the single laser anneal consists of 2-3 radiation pulses at a 532 nm wavelength for 50-60 nanoseconds per pulse, crystallizing the $HfO_2$.

FIG. 7 is a transmission electron microscope (TEM) image of a layer stack from top to bottom of 30 nm TiN/20 nm TiN/6.8 nm $HfO_2$/10 nm TiN/90 nm $SiO_2$ on a Si wafer with $HfO_2$ grown by atomic layer deposition (ALD) at 250° C. and the layered stack is not annealed. The $HfO_2$ is predominantly non-crystalline. FIG. 8 is a TEM image of a layer stack from top to bottom of 30 nm TiN/20 nm TiN/6.8 nm $HfO_2$/10 nm TiN/90 nm $SiO_2$ on a Si wafer with $HfO_2$ grown by atomic layer deposition (ALD) at 250° C. wherein the stack was exposed to a single laser anneal after deposition of the 20 nm TiN layer, and the single laser anneal consists of 2-3 radiation pulses at a 532 nm wavelength for 50-60 nanoseconds per pulse, crystallizing the $HfO_2$.

Figure 9:
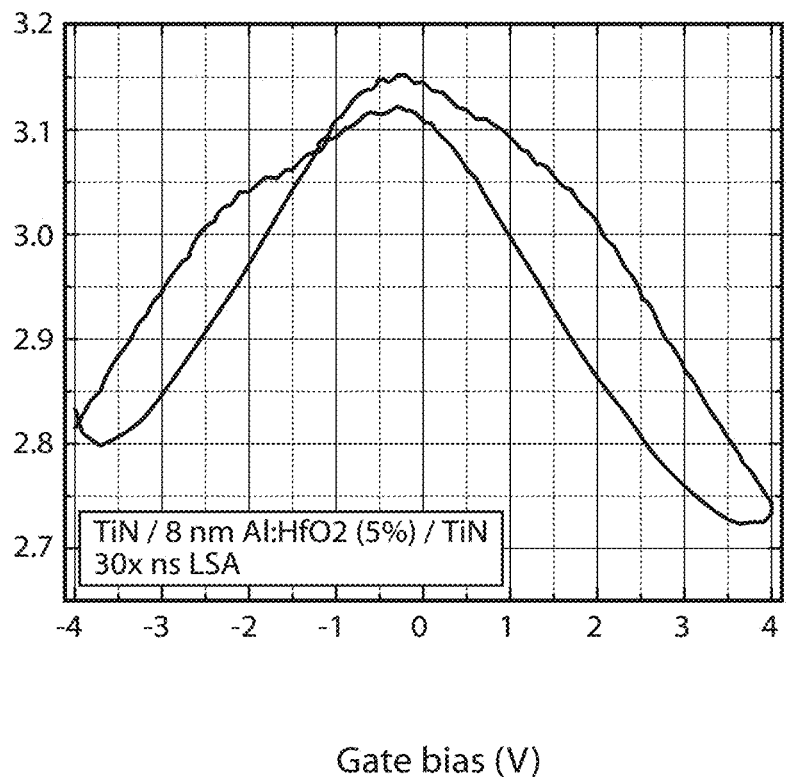
FIG. 9 is a plot of capacitance as a function of gate electrode bias for a capacitor layer stack having from top to bottom 30 nm TiN/20 nm TiN/8 nm Al-doped $HfO_2$ (5% Al)/10 nm TiN/90 nm $SiO_2$ on a Si wafer with Al-doped $HfO_2$ grown by atomic layer deposition (ALD) at 250° C. wherein the stack was exposed to 30 laser anneals after deposition of the 20 nm TiN layer, and each laser anneal consists of 2-3 radiation pulses at a 532 nm wavelength for 50-60 nanoseconds per pulse, which provides ferroelectric characteristics.

FIG. 9 is a plot of capacitance as a function of gate electrode bias for a capacitor layer stack having from top to bottom 30 nm TiN/20 nm TiN/8 nm Al-doped $HfO_2$ (5% Al)/10 nm TiN/90 nm $SiO_2$ on a Si wafer with Al-doped $HfO_2$ grown by atomic layer deposition (ALD) at 250° C. wherein the stack was exposed to 30 laser anneals after deposition of the 20 nm TiN layer, and each laser anneal consists of 2-3 radiation pulses at a 532 nm wavelength for 50-60 nanoseconds per pulse, which provides ferroelectric characteristics.

Figure 10:
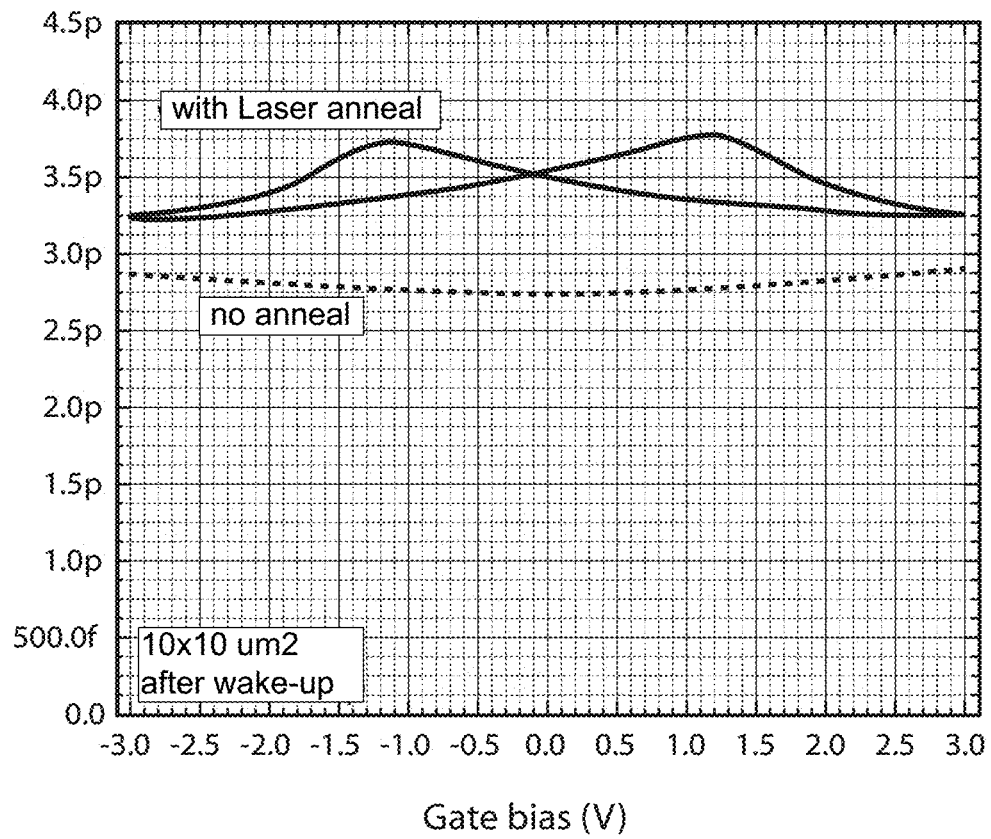
FIG. 10 is a plot of capacitance as a function of gate electrode bias for a capacitor layer stack having from top to bottom 30 nm TiN/20 nm TiN/6.8 nm $HfO_2$/10 nm TiN/90 nm $SiO_2$ on a Si wafer with $HfO_2$ grown by atomic layer deposition (ALD) at 250° C. for a sample without Laser anneal, and for a sample wherein the stack was exposed to a single laser anneal after deposition of the 20 nm TiN layer, and the single laser anneal consists of 2-3 radiation pulses at a 532 nm wavelength for 50-60 nanoseconds per pulse, which provides ferroelectric characteristics.

FIG. 10 is a plot of capacitance as a function of gate electrode bias for a capacitor layer stack having from top to bottom 30 nm TiN/20 nm TiN/6.8 nm $HfO_2$/10 nm TiN/90 nm $SiO_2$ on a Si wafer with $HfO_2$ grown by atomic layer deposition (ALD) at 250° C. for a sample without Laser anneal, and for a sample wherein the stack was exposed to a single laser anneal after deposition of the 20 nm TiN layer, and the single laser anneal consists of 2-3 radiation pulses at a 532 nm wavelength for 50-60 nanoseconds per pulse, which provides ferroelectric characteristics.

Figure 11:
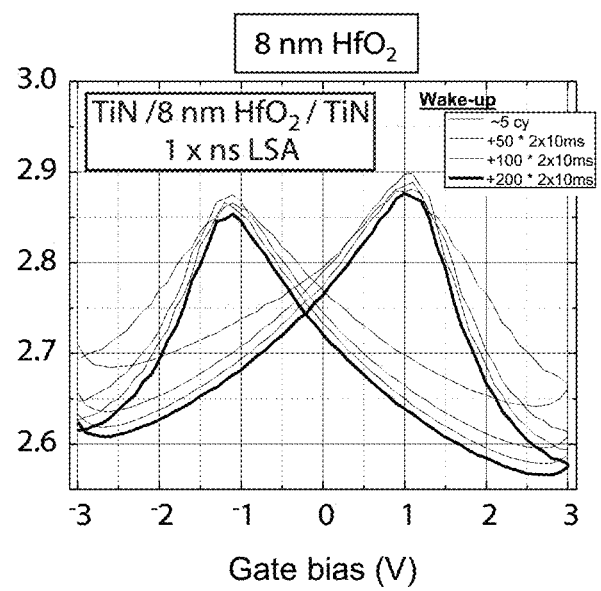
FIG. 11 is a plot of capacitance as a function of gate electrode bias (recorded after applying varying numbers of electrical voltage pulses) for a capacitor layer stack having from top to bottom 30 nm TiN/20 nm TiN/8 nm $HfO_2$/10 nm TiN/90 nm $SiO_2$ on a Si wafer with $HfO_2$ grown by atomic layer deposition (ALD) at 250° C., wherein the stack was exposed to a single laser anneal after deposition of the 20 nm TiN layer, and the single laser anneal consists of 2-3 radiation pulses at a 532 nm wavelength for 50-60 nanoseconds per pulse, which provides ferroelectric characteristics.

FIG. 11 is a plot of capacitance as a function of gate electrode bias (recorded after applying varying numbers of electrical voltage pulses) for a capacitor layer stack having from top to bottom 30 nm TiN/20 nm TiN/8 nm $HfO_2$/10 nm TiN/90 nm $SiO_2$ on a Si wafer with $HfO_2$ grown by atomic layer deposition (ALD) at 250° C., wherein the stack was exposed to a single laser anneal after deposition of the 20 nm TiN layer, and the single laser anneal consists of 2-3 radiation pulses at a 532 nm wavelength for 50-60 nanoseconds per pulse, which provides ferroelectric characteristics.

Figure 12:
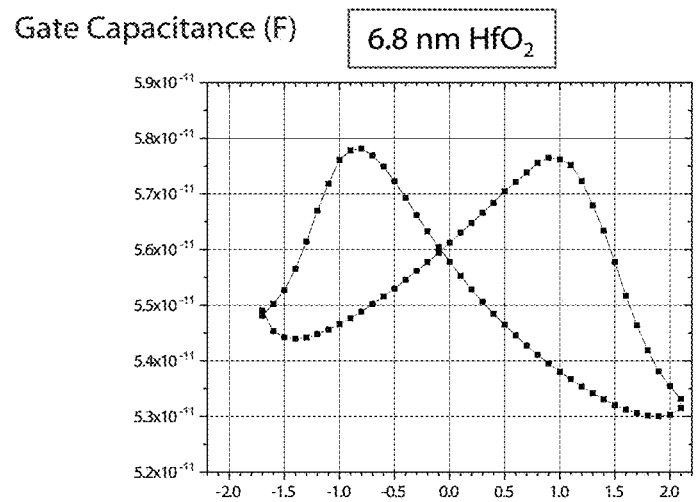
FIG. 12 is a plot of capacitance as a function of gate/electrode bias for a capacitor layer stack having from top to bottom 30 nm TiN/20 nm TiN/6.8 nm $HfO_2$/10 nm TiN/90 nm $SiO_2$ on a Si wafer with $HfO_2$ grown by atomic layer deposition at 250° C., wherein the stack was exposed to a single laser anneal after deposition of the 20 nm TiN layer, and the single laser anneal consists of 2-3 radiation pulses at a 532 nm wavelength for 50-60 nanoseconds per pulse, which provides ferroelectric characteristics.

FIG. 12 is a plot of capacitance as a function of gate/electrode bias for a capacitor layer stack having from top to bottom 30 nm TiN/20 nm TiN/6.8 nm $HfO_2$/10 nm TiN/90 nm $SiO_2$ on a Si wafer with $HfO_2$ grown by atomic layer deposition at 250° C., wherein the stack was exposed to a single laser anneal after deposition of the 20 nm TiN layer, and the single laser anneal consists of 2-3 radiation pulses at a 532 nm wavelength for 50-60 nanoseconds per pulse, which provides ferroelectric characteristics.

Figure 13:
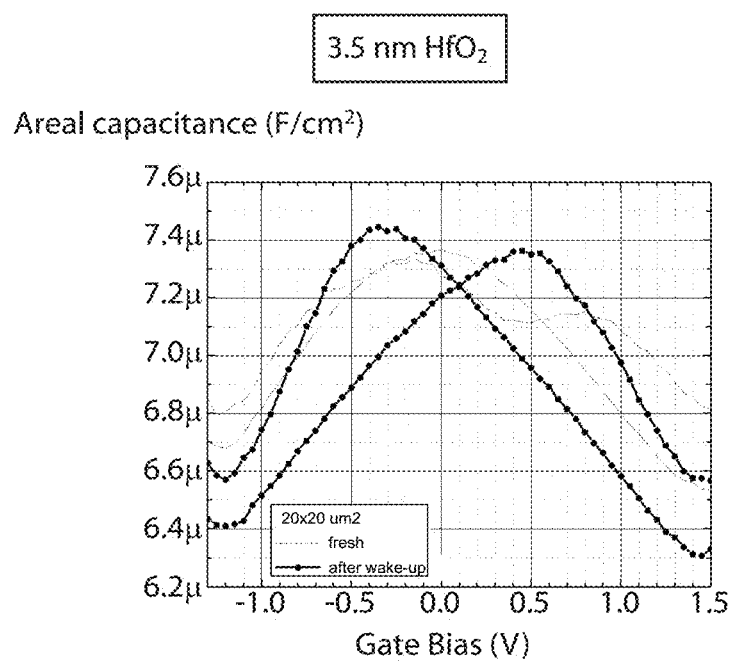
FIG. 13 is a plot of capacitance as a function of gate/electrode bias (recorded on a freshly fabricated device as well as after applying electrical voltage pulses) for a capacitor layer stack having from top to bottom 30 nm TiN/20 nm TiN/3.5 nm $HfO_2$/10 nm TiN/90 nm $SiO_2$ on a Si wafer with $HfO_2$ grown by atomic layer deposition at 250° C., wherein the stack was exposed to a single laser anneal after deposition of the 20 nm TiN layer, and the single laser anneal consists of 2-3 radiation pulses at a 532 nm wavelength for 50-60 nanoseconds per pulse, which provides ferroelectric characteristics.

FIG. 13 is a plot of capacitance as a function of gate electrode bias (recorded on a freshly fabricated device as well as after applying electrical voltage pulses) for a capacitor layer stack having from top to bottom 30 nm TiN/20 nm TiN/3.5 nm $HfO_2$/10 nm TiN/90 nm $SiO_2$ on a Si wafer with $HfO_2$ grown by atomic layer deposition at 250° C., wherein the stack was exposed to a single laser anneal after deposition of the 20 nm TiN layer, and the single laser anneal consists of 2-3 radiation pulses at a 532 nm wavelength for 50-60 nanoseconds per pulse, which provides ferroelectric characteristics.

Figure 14:
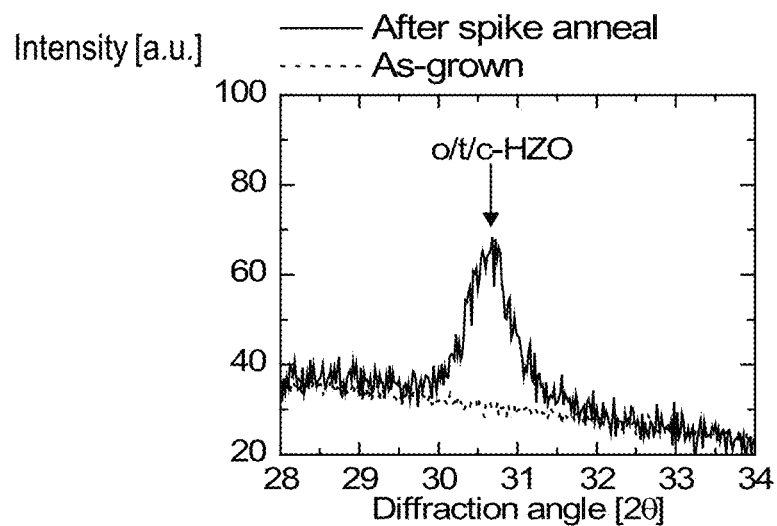
FIG. 14 is a plot of X-ray diffractograms of a layer stack from top to bottom of 10 nm TiN/10 nm $(Hf,Zr)O_2$/10 nm TiN on a Si wafer, wherein the $(Hf,Zr)O_2$ is grown by atomic layer deposition at 250° C. (dotted line), and additionally exposed to 70 $J/cm^2$/20 ms flash spike anneal after 120 s preheat at 375° C. (full line).

FIG. 14 is a plot of X-ray diffractograms of a layer stack from top to bottom of 10 nm TiN/10 nm (Hf, Zr)$O_2$/10 nm TiN on a Si wafer, wherein the (Hf, Zr)$O_2$ is grown by atomic layer deposition at 250° C. (dotted line), and additionally exposed to a flash spike anneal having the temperature level 202 of around 375° C., the flash radiation exposure duration of 20 ms, the flash incident energy density about 70 J/cm$^2$ (full line). The estimated temperature level 205 is 750° C. to 875° C. and the estimated temperature level 203 is 500° C. to 550° C. The stack has been kept at the level 202 for about 120 s.

FIG. 14 demonstrates that the hafnium oxide (Hf,Zr)$O_2$ layer is converted from being predominantly amorphous to being predominantly crystalline.

Figure 15:
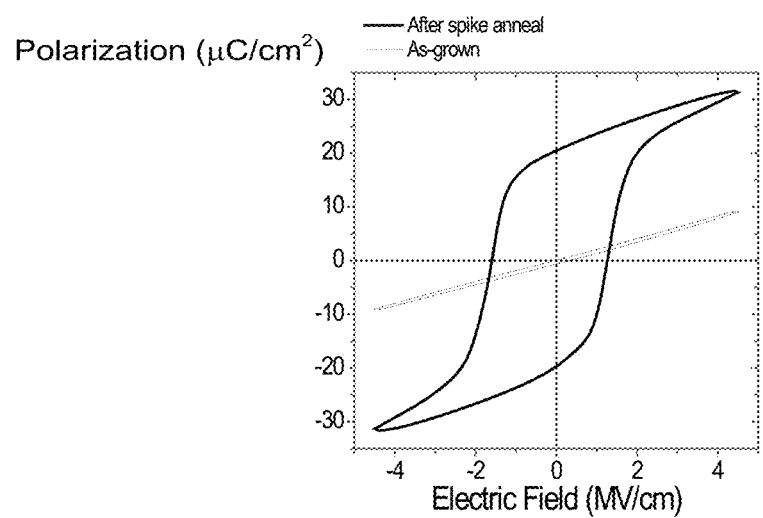
FIG. 15 is a plot of polarization-voltage data of a layer stack from top to bottom of 10 nm TiN/10 nm $(Hf,Zr)O_2$/10 nm TiN on a Si wafer, wherein the $(Hf,Zr)O_2$ is grown by atomic layer deposition at 250° C. (dotted line), and additionally exposed to 70 $J/cm^2$/20 ms flash spike anneal after 120 s preheat at 375° C. (full line), showing the absence of ferroelectricity in the as grown sample and the presence of ferroelectricity in the annealed sample.

FIG. 15 is a plot of polarization-voltage data of a layer stack from top to bottom of 10 nm TiN/10 nm (Hf,Zr)$O_2$/10 nm TiN on a Si wafer, wherein the (Hf,Zr)$O_2$ is grown by atomic layer deposition at 250° C. (dotted line), and additionally exposed to flash spike anneal of the type used for the stack shown in FIG. 14 (full line), showing the absence of ferroelectricity in the as grown sample and the presence of ferroelectricity in the annealed sample.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Having described preferred embodiments of a method of a nanosecond or millisecond recrystallization of hafnium or zirconium based oxides (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for converting a predominantly non-crystalline dielectric material including a type IV transition metal oxide into a crystalline material comprising:
    forming a predominantly non-crystalline dielectric material including the type IV transition metal on a supporting substrate; and
    converting the predominantly non-crystalline dielectric material including the type IV transition metal to a crystalline crystal structure by exposure to energy for a nanosecond duration, wherein said crystalline crystal structure comprises a ferroelectric phase, wherein the type IV transition metal converted to the crystalline crystal structure is present in a metal insulator metal (MIM) capacitor.

2. The method of claim 1, wherein said supporting substrate comprises a semiconductor material, polymeric material, dielectric material, metallic compound or a combination thereof.

3. The method of claim 1, wherein the predominantly non-crystalline dielectric material including the type IV transition metal is selected from the group consisting of hafnium oxide ($HfO_2$), zirconium oxide ($ZrO_2$), and a combination thereof.

4. The method of claim 1, wherein during said conversion to said crystalline crystal structure, adjacently positioned components of the electrical device do not experience thermal degradation.

5. The method of claim 4, wherein thermal degradation is selected from the group consisting of change in a threshold voltage of the electrical device resulting from said exposure to energy, shift in a transistor threshold voltage of the electrical device, thickening of a gate dielectric of the electrical device, degradation of interconnect reliability of the electrical device, degradation of interconnect low-k dielectric, and a combination thereof.

6. The method of claim 1, wherein said exposure to energy for said duration is provided by laser annealing with an energy density range of 0.1 J/cm² to about 3 J/cm².

7. The method of claim 1, wherein said duration for the exposure to energy is 1 nanosecond to 10,000 nanoseconds.

8. The method of claim 1, wherein the predominantly non-crystalline dielectric material is a component of an electrical device having a scale of microscale or less that is selected from the group consisting of field effect transistors (FETs), dynamic random access memory (DRAM), metal insulator metal (MIM) decoupling capacitors, ferroelectric random access memory (FeRAM), ferroelectric field effect transistor (FeFET), ferroelectric tunnel junction (FTJ), resistive random access memory (RRAM), electro-optical modulators, electro-optical switches, neuromorphic devices and combinations thereof.

9. A method of converting a dielectric material into a crystalline material comprising:
forming a predominantly non-crystalline hafnium oxide containing material on a supporting substrate as a component of an electrical device having a scale of microscale or less; and
converting the predominantly non-crystalline hafnium oxide containing material to a crystalline crystal structure by exposure to energy for durations of less than 100 milliseconds, the crystalline crystal structure comprising a ferroelectric phase and being present in a metal insulator metal (MIM) capacitor, wherein adjacently positioned components of the electrical device do not experience thermal degradation.

10. The method of claim 9, wherein thermal degradation is selected from the group consisting of change in a threshold voltage of the electrical device resulting from said exposure to energy, shift in a transistor threshold voltage of the electrical device, thickening of a gate dielectric of the electrical device, degradation of interconnect reliability of the electrical device, degradation of interconnect low-k dielectric and a combination thereof.

11. The method of claim 10, wherein the predominantly non-crystalline hafnium oxide containing material that is converted to the crystalline crystal structure has a thickness of less than 5 nm.

12. The method of claim 10, wherein the predominantly non-crystalline hafnium oxide containing material is pure hafnium oxide.

13. The method of claim 10, wherein said duration for the exposure to energy is 0.1 millisecond to 100 milliseconds.

14. The method of claim 10, wherein said duration for the exposure to energy is 1 nanosecond to 10,000 nanoseconds.

* * * * *